Nov. 13, 1956 W. K. JACKSON 2,770,683

NEUTRALIZED AMPLIFIER CIRCUIT

Filed June 18, 1952 2 Sheets-Sheet 1

INVENTOR.
WILLIAM K. JACKSON
BY
Brown, Denk & Synnestvedt
AGENTS

Nov. 13, 1956 W. K. JACKSON 2,770,683

NEUTRALIZED AMPLIFIER CIRCUIT

Filed June 18, 1952 2 Sheets-Sheet 2

INVENTOR.
WILLIAM K. JACKSON
BY
Brown, Denk & Synnestvedt
AGENTS 2,770,683

NEUTRALIZED AMPLIFIER CIRCUIT

William K. Jackson, Philadelphia, Pa., assignor to Philco Corporation, Philadelphia, Pa., a corporation of Pennsylvania Application June 18, 1952, Serial No. 294,241

9 Claims. (Cl. 179—171)

This invention relates to signal amplifiers and more particularly to means for neutralizing amplifiers of the pentode type.

In high-gain amplifiers of the pentode type, for example in intermediate frequency amplifiers operating in the range of several hundred kilocycles and above, energy fed back to the input circuit of the amplifier through plate-to-grid capacitance of the pentode tube causes instability in the operation of the amplifier stage. Various schemes have been advanced for neutralizing this feedback of energy. One scheme used in tuned pentode amplifier stages is to connect the screen grid of the pentode to ground through a capacitor that is less than a complete by-pass for signals having frequencies lying within the passband of the amplifier stage. While this means for neutralizing an amplifier stage is reasonably satisfactory for amplifiers having relatively narrow bandwidths, it is not adequate for wide-band amplifiers at any frequency. It can be shown that the proper value for the screen bypass capacitor to give the desired neutralization is a function of the output impedance of the amplifier stage. This output impedance is usually frequency sensitive so that the value selected for the screen grid by-pass capacitor in a wideband amplifier is correct at only one frequency. The value selected for this capacitor is usually a compromise between the proper values at the two ends of the passband of the amplifier.

A second method of neutralizing a pentode amplifier stage is disclosed in United States Patent No. 2,154,327 assigned to the assignee of this application. In the system employed in the above-mentioned patent, a tertiary coil is coupled to the secondary coil of the input transformer of the pentode amplifier stage. The signal developed across this tertiary coil is applied to the suppressor grid of the pentode amplifier tube. The system shown in the above-mentioned patent operates successfully in relatively narrow band amplifiers at frequencies measured in the hundreds of kilocycles. However, it is frequency sensitive and therefore is not adapted for use in wide-band amplifiers. Furthermore, it is difficult, if not impossible, to provide the turns ratio between the tertiary coil and the secondary coil of the input transformer required by that system at frequencies of the order of 20 to 40 megacycles. At these frequencies the secondary winding on the input transformer usually is made up of only 10 or 20 turns. This would necessitate a tertiary winding having only a small fraction of a single turn. Furthermore, the system shown in the above-mentioned patent does not take into account input loading of the amplifier stage which is appreciable in amplifiers operating at frequencies of the order of one megacycle and above.

Therefore, it is an object of the present invention to provide an improved pentode amplifier stage.

It is a further object of the present invention to provide an improved neutralizing circuit for a pentode amplifier stage.

Another object of the invention is to provide an improved pentode amplifier stage that is neutralized over a wide band of frequencies.

Still another object of the present invention is to provide a neutralized pentode amplifier stage, the neutralization of which is independent of the output loading of the amplifier.

These and other objects of the invention are accomplished by providing a circuit in which the screen grid is completely by-passed to cathode and the suppressor grid is returned to ground through an impedance determined by the characteristics of the tube. The input signal in this novel circuit is applied between the control grid and the suppressor grid rather than between control grid and cathode.

For a better understanding of the invention and the various objects, features and advantages thereof, reference should be had to the following detailed description which is to be read in connection with the accompanying drawings in which.

Figure 1:
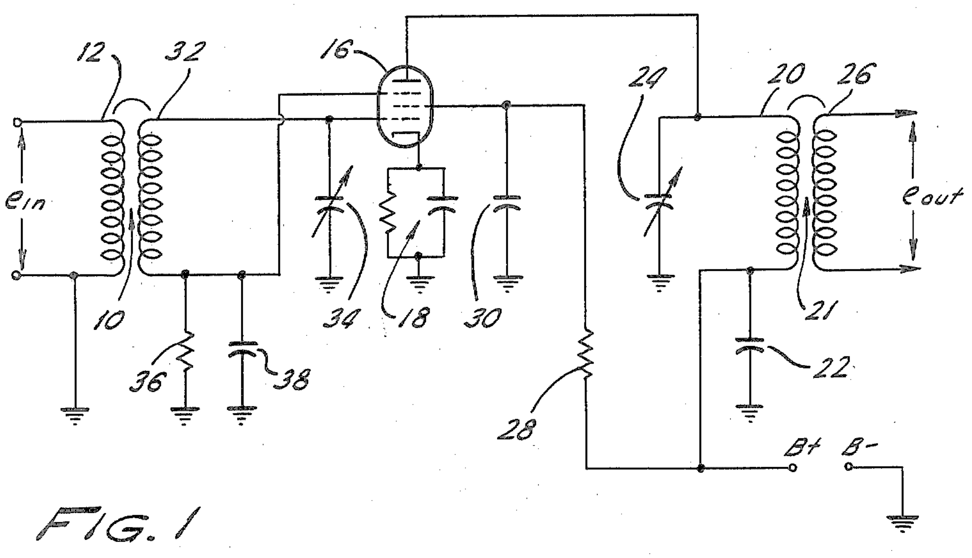
Fig. 1 is a schematic diagram of a pentode amplifier stage constructed in accordance with the teachings of the present invention.

In Fig. 1, the input signal to be amplified is applied across the primary winding 12 of a transformer 10. As shown in the drawing, one terminal of the primary winding 12 of this transformer is returned directly to ground. However, in the event that an amplifier constructed in accordance with the teachings of the present invention is one of a series of amplifier stages, transformer 10 would correspond to the conventional interstage coupling transformer customarily employed in high frequency amplifier circuits. In this event, one terminal of the primary winding 12 would be connected to the anode of the tube in the preceding stage and the other terminal returned to the anode potential supply source with suitable by-passing to ground. However, the circuit supplying the signal to primary winding 12 forms no part of the present invention and hence will not be described further.

The amplifier stage of the present invention includes a pentode amplifier tube 16 having the cathode returned to ground through a suitable resistor-capacitor biasing circuit 18. The anode of pentode amplifier tube 16 is returned to the anode supply source represented by the symbols B+ and B− through the primary 20 of a second transformer 21. Transformer 21 may be an output transformer or a second interstage coupling transformer. Transformers 10 and 21 may be single, double or triple tuned transformers, as desired. Transformer 21 may be replaced by a self resonant inductance or any other suitable form of load impedance that suits the needs of the circuit designer. The end of winding 20 that is remote from the anode of tube 16 is by-passed to ground for the signal frequencies by a capacitor 22. Winding 20 may also be made to resonate at the desired frequency of operation of the amplifier stage by connecting a suitable adjustable capacitor 24 in shunt therewith. The output of the amplifier stage shown in Fig. 1 is obtained from a secondary winding 26 of transformer 21 which is magnetically coupled to winding 20. Winding 26 may also be tuned to the operating frequency by a suitable capacitor (not shown in Fig. 1). It will be pointed out in connection with the description of Fig. 3 that the impedance of the output circuit or any variation thereof with frequency will not affect the operation of an amplifier stage neutralized in accordance with the teaching of the present invention.

The screen grid of tube 16 is returned to a positive potential, here shown as the anode supply potential, through a dropping resistor 28. The screen grid is also by-passed to ground at all signal frequencies by capacitor 30. In the present invention, capacitor 30 is made large enough to provide complete by-passing to ground at all frequencies of operation of the amplifier stage. In the circuit of the present invention, the screen grid is effectively connected directly to the cathode at all signal frequencies since the capacitor in biasing circuit 18 is also a complete by-pass at all signal frequencies. In some instances it may be more convenient to return capacitor 30 directly to the cathode. This will not alter the operation of the circuit in any way. In addition, it may be desirable to connect one end of winding 20 directly to the screen grid rather than directly to the positive terminal of the anode potential source as shown in Fig. 1. If winding 20 is returned to the screen grid, capacitor 22 may be eliminated since capacitor 30 will serve as a by-pass to ground for both winding 20 and the screen grid.

It will be recognized that one difference between the circuit of the present invention and prior art screen grid neutralization circuits is to be found in the size of the screen grid by-pass capacitor. In the circuit of the present invention this capacitor is made sufficiently large to permit complete by-passing to ground of all signal frequencies whereas in circuits employing screen grid neutralization this capacitor is made rather small so that feedback through the anode-to-control grid capacitance is neutralized by variations in potential of the screen grid.

The secondary winding 32 of transformer 10 is magnetically coupled to primary winding 12 and is tuned to resonance by an adjustable capacitor 34. One terminal of secondary winding 32 is connected to the control grid of tube 16 in the conventional manner. However, the second terminal of winding 32 is connected to the suppressor grid of pentode amplifier tube 16. Again, this is a departure from the conventional practice of returning one terminal of the secondary of the input transformer to ground or to the cathode of the amplifier tube. The suppressor grid of tube 16 is returned to ground through a parallel combination of resistor 36 and capacitor 38. The values of resistor 36 and capacitor 38 are selected to give the proper neutralization of the circuit. The manner in which the appropriate values of resistor 36 and capacitor 38 may be determined will be explained hereinafter in connection with the description of Fig. 4.

Figure 2:
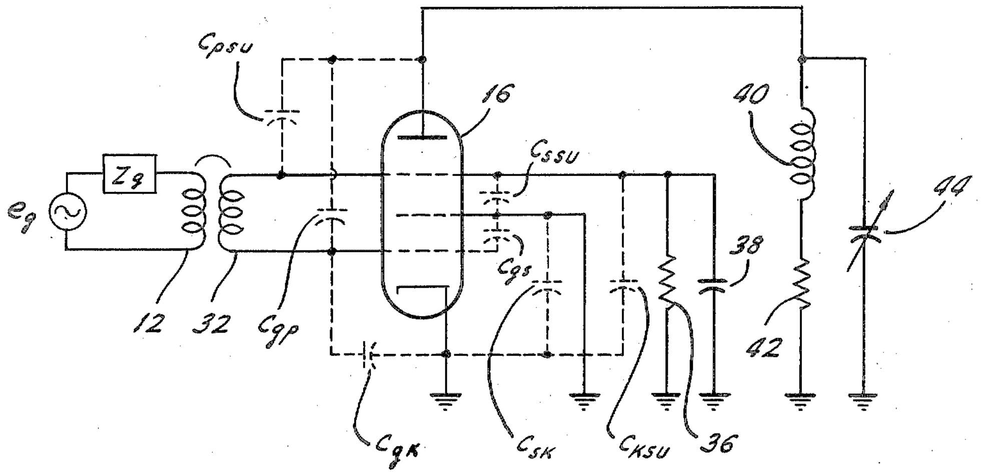
Fig. 2 is a simplified schematic diagram of the circuit of Fig. 1.

The operation of the amplifier stage of Fig. 1 may be more fully comprehended if the circuit is redrawn as shown in Fig. 2. Fig. 2 is a high frequency equivalent circuit of the amplifier stage of Fig. 1. In this high frequency equivalent circuit, sources of direct potential and circuit elements providing a complete by-pass at the frequency of operation do not appear. As shown in Fig. 2, the cathode and screen grid of electron tube 16 are effectively at ground potential for the high frequency signal. The anode is returned to ground through an impedance represented by the series-parallel combination of inductor 40, resistor 42 and capacitor 44. It is to be understood that this series-parallel combination represents the impedance at the operating frequency of all circuits connected to the anode of tube 16 in Fig. 1. The positions of resistor 36 and capacitor 38 have been changed to Fig. 2 but the point of connection remains the same as that shown in Fig. 1, namely, to the suppressor grid of the amplifier stage. The circuit for supplying the input signal to primary winding 12 of transformer 10 is schematically illustrated by a generator $e_g$ and the internal impedance $Z_g$ of this generator. Also shown in Fig. 2 are the various interelectrode capacitances of a pentode amplifier tube. These capacitances include the anode-to-control grid capacitance $C_{gp}$, the anode-to-suppressor grid capacitance $C_{psu}$, the cathode-to-control grid capacitance $C_{gk}$, the suppressor grid-to-screen grid capacitance $S_{ssu}$, the screen grid-to-control grid capacitance $C_{gs}$, the cathode-to-suppressor grid capacitance $C_{ksu}$ and the cathode-to-screen grid capacitance $C_{sk}$. As will be pointed out in the description of Figs. 3 and 4, certain of these interelectrode capacitances may be ignored in selecting the proper values of resistor 36 and capacitor 38 if adequate by-passing capacitors are employed at selected points in the amplifier stage.

Figure 3:
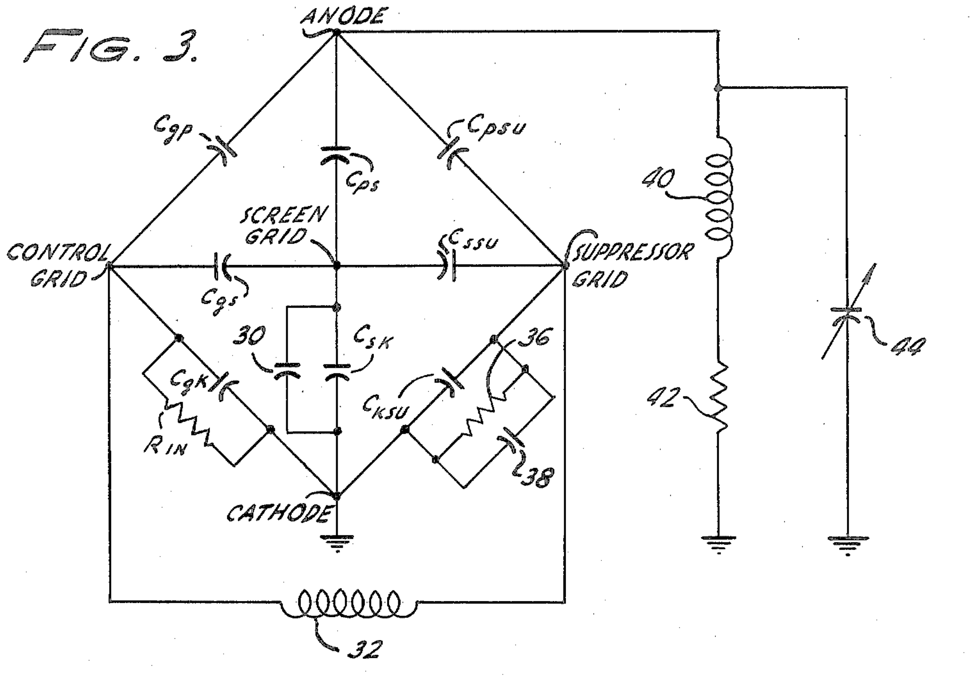
Fig. 3 is an equivalent circuit of the amplifier stage of Fig. 1 arranged in the form of a bridge circuit.

Referring now to Fig. 3, the equivalent circuit of Fig. 2 is redrawn in the form of a five-terminal bridge circuit. The input loading of the amplifier stage resulting from transit time effects and other factors is represented by the resistor $R_{in}$ in shunt with capacitance $C_{gk}$. Any reactive component of input loading or of the input circuit may be lumped with the grid-to-cathode capacitance $C_{gk}$. In the redrawing of the circuit of Fig. 2, the screen grid is shown separated from the cathode by capacitor 30 and the screen grid-to-cathode interelectrode capacitance $C_{sk}$.

In screen grid neutralized amplifier stages it is assumed that the cathode and the suppressor grid are at the same potential and that the circuit of Fig. 3 may be redrawn as a four-terminal bridge having the control grid and the cathode as one pair of opposite terminals and the anode and screen grid as the second pair of opposite terminals. The four arms of this bridge circuit are formed by the anode-to-control grid capacitance $C_{gp}$, the control grid to screen grid capacitance $C_{gs}$, the cathode-to-screen grid capacitance in parallel with capacitor 30, and the anode-to-cathode or output capacitance $C_o$, respectively. The input signal is applied between the opposite terminals representing the cathode and the control grid. In order to complete the bridge circuit it is assumed that the output load impedance is connected between the opposite terminals representing the anode and screen grid. In this bridge circuit the output capacitance $C_o$ is an effective capacitance representing the sum of certain of the interelectrode capacitances of the tube in combination with the capacitance of the output circuit. In a double tuned or absorption trap stage the capacitance of the output circuit and hence the effective output capacitance $C_o$ is a function of the operating frequency. Since the capacitance $C_o$ (and not merely the impedance represented by this capacitance) is a function of frequency, the proper value of capacitor 30 in a screen grid neutralized stage is also a function of frequency. Furthermore, in drawing the equivalent bridge circuit for a screen grid neutralization circuit, it is assumed that the output signal is generated between the anode and screen grid when in fact it is generated between anode and cathode. Therefore, an amplifier stage employing screen grid neutralization is exactly neutralized at only one frequency and is neutralized to within tolerable limits for only a very narrow band of frequencies.

In the present invention the input signal is applied between two opposite terminals of the bridge as drawn in Fig. 3, namely, between the control grid and the suppressor grid terminals. The output circuit is connected between the other pair of opposite terminals, namely, the anode and cathode terminals of the bridge. If capacitor 30 is made sufficiently large so that it acts as a complete by-pass at the frequency of operation of the amplifier stage, the five-terminal bridge circuit of Fig. 3 may be redrawn as the four-terminal bridge shown in Fig. 4.

Figure 4:
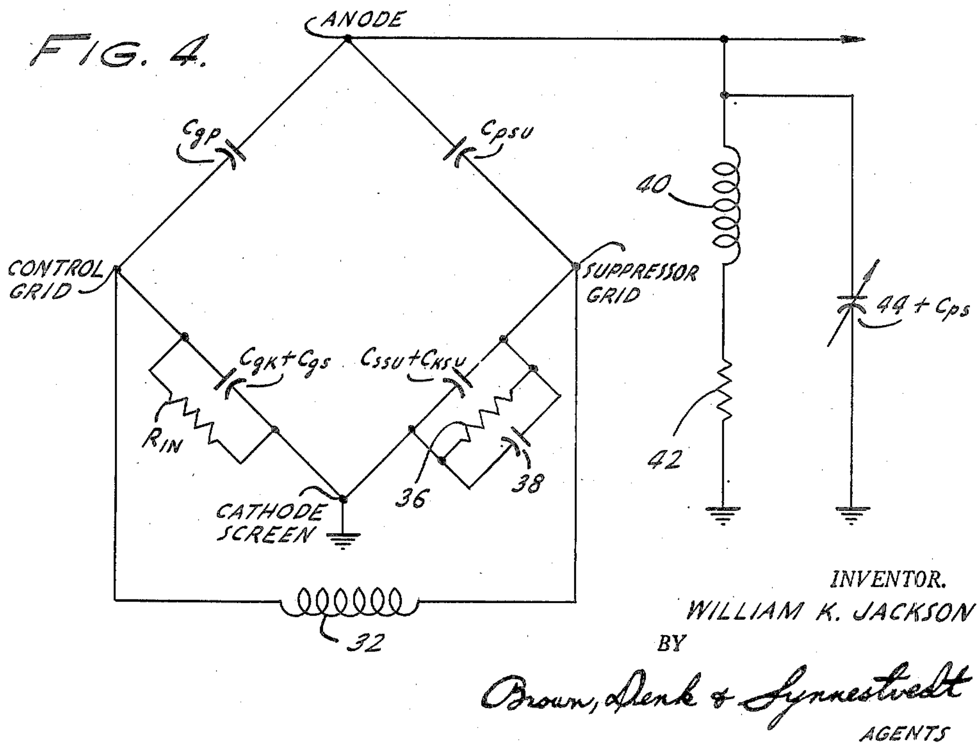
Fig. 4 is a simplified equivalent bridge circuit obtained by selecting certain components of the amplifier stage of Fig. 1 to give complete by-passing at the frequency of operation of the amplifier stage.

In Fig. 4 the lowermost point of the four-terminal bridge now represents both cathode and screen grid since these two points are effectively connected together at all signal frequencies. The control grid-to-screen grid interelectrode capacitance $C_{gs}$ is now effectively in parallel with $C_{gk}$. The sum of $C_{gs}$, $C_{gk}$ and any other reactive component of the input circuit will be referred to hereinafter as the input capacitance $C_{in}$. The screen grid-to-suppressor grid capacitance is effectively in parallel with the cathode-to-suppressor grid capacitance and the anode-to-screen grid capacitance $C_{ps}$ is in parallel with the output capacitance 44. It is apparent from Fig. 4 that the bridge equivalent circuit of the amplifier stage of Fig. 1 may be balanced by selecting the proper values of resistor 36 and capacitor 38 in accordance with well known bridge theory. The total capacitance between the suppressor grid and cathode, hereinafter referred to as $C_t$, is equal to $$\frac{C_{psu}C_{in}}{C_{gp}}$$

and the total resistance between suppressor grid and cathode, hereinafter referred to as $R_t$, is equal to $$R_{in}\frac{C_{gp}}{C_{psu}}$$

In actual practice, the value of $C_{psu}$ may be taken to be approximately equal to $C_o$, $C_o$ being the total output capacitance of the pentode tube. This is a fairly good approximation since most of the output capacitance of the tube exists between the anode and suppressor grid. The value of capacitor 38 may be determined by subtracting the value of $C_{ssu}$ and $C_{ksu}$ from the value of $C_t$ as determined above. In practice, the value of capacitor 38 may be taken as being equal to the value of $C_t$ since $C_{ssu}$ and $C_{ksu}$ are relatively small. It will be noted that, in the bridge circuit of Fig. 4, variations in the output impedance do not affect the balance of the bridge and hence cannot cause feedback to the input circuit. Therefore, the neutralization of an amplifier stage constructed in accordance with the teachings of the present invention is relatively insensitive to changes in signal frequency and, for this reason, the amplifier may have a relatively broad band if desired.

The values of the various circuit parameters of Fig. 4 for well known types of pentode tubes are available in the published literature. However, it is believed that the following specific example will serve to illustrate further the operation of the present invention. A typical modern pentode tube operating at 45 megacycles has the following values for the circuit parameters:

$C_{in}$=10 mmf.
$C_o$=5 mmf.
$C_{gp}$=.025 mmf.
$R_{in}$=15K ohms.

An amplifier stage including this tube may be neutralized using the following values:

Capacitor 38=2000 mmf.
Resistor 36=75 ohms

While the neutralized amplifier stage described above is particularly useful in intermediate frequency amplifiers operating in the frequency range of 20 megacycles and above, it should be apparent that the circuit is not limited in operation to this region nor to this particular type of amplifier. Therefore, while there has been described what is at present considered to be the preferred embodiment of the present invention, the scope of the invention is to be determined by reference to the hereinafter appended claims.

What is claimed is:

1. A signal amplifier stage for amplifying signals within a predetermined range of frequencies, comprising an electron tube having at least a cathode, a control grid, a screen grid, a suppressor grid and an anode arranged in the order recited, a load impedance and a source of anode supply potential connected in the anode-cathode circuit of said electron tube, means returning said screen grid to a source of positive potential, capacitive by-passing means connecting said screen grid to said cathode, said by-passing means having substantially zero impedance at signal frequencies within said predetermined range, a transformer having at least a primary and a secondary winding, the respective ends of said secondary winding being connected to said control grid and said suppressor grid, means for supplying the signal to be amplified to the primary of said transformer, and a network including a resistor and capacitor in parallel combination connected between said suppressor grid and said cathode, said resistor and said capacitor being separate from the anode-cathode circuit of said electron tube, said capacitor having a capacitance substantially equal to the product of the effective capacitance between said control grid and said cathode and the effective capacitance between said anode and said suppressor grid divided by the capacitance between said anode and said control grid, said resistor having a resistance substantially equal to the input resistance of said amplifier stage multiplied by the capacitance between said anode and said control grid and divided by the capacitance between said anode and said suppressor grid.

2. A signal amplifier stage for amplifying signals within a predetermined band of frequencies comprising an electron tube having a cathode, a control grid, a screen grid, a suppressor grid and an anode arranged in the order recited, a source of anode supply potential, a load impedance connected between said anode and one terminal of said source of potential, means connecting a second terminal of said source of potential to said cathode, means connected between a point of reference potential and said cathode and said screen grid for maintaining said cathode and said screen grid at fixed potentials for all frequencies within said band, means for applying the signal to be amplified between said control grid and said suppressor grid, and a resistor and a capacitor in parallel combination connecting said suppressor grid to said point of reference potential, said parallel combination being separate from the anode-cathode circuit of said electron tube, said capacitor having an impedance greater than substantially zero at signal frequencies within said predetermined band, the impedance of said resistor-capacitor combination being such as to effectively neutralize feedback through the interelectrode capacitances of said electron tube.

3. A signal amplifier stage for amplifying signals within a predetermined band of frequencies comprising an electron tube having a cathode, a control grid, a screen grid, a suppressor grid and anode arranged in the order recited, a source of anode supply potential, a load impedance connected between said anode and one terminal of said source of potential, means connecting a second terminal of said source of potential to said cathode, means connected between a point of reference potential and said cathode and said screen grid for maintaining said cathode and said screen grid at fixed potentials for all signal frequencies within said band, a transformer having at least a primary and a secondary winding, said secondary winding being connected at the respective ends thereof to said control grid and said suppressor grid, means for supplying the signals to be amplified to said primary winding, and a neutralizing network separate from the anode-cathode circuit of said electron tube and including a resistor and a capacitor in parallel combination connecting said suppressor grid to said point of reference potential, said capacitor having a capacitance substantially directly proportional to the input capacitance of said amplifier stage and the output capacitance of said electron tube and inversely proportional to the anode-to-control grid capacitance of said tube, said resistor having a value substantially directly proportional to the effective input resistance and the anode-to-control grid capacitance of said tube and inversely proportional to the output capacitance of said tube.

4. In a signal amplifier stage having input and output transformers tuned to signal frequencies above one hundred kilocycles, said amplifier stage including a pentode amplifier tube, means establishing a path of substantially zero impedance at said signal frequencies between the cathode and the screen grid of said pentode amplifier tube and a point of reference potential, means for applying the signal to be amplified between the control grid and the suppressor grid of said pentode tube and a neutralizing network comprising a resistor and capacitor in parallel combination, said network being connected between said suppressor grid and said point of reference potential, said capacitor having a capacitance substantially directly proportional to the input capacitance of said amplifier stage and the output capacitance of said electron tube and inversely proportional to the anode-to-control grid capacitance of said tube, said resistor having a value substantially directly proportional to the effective input resistance and the anode-to-control grid capacitance of said tube and inversely proportional to the output capacitance of said tube.

5. A signal amplifier stage including a pentode electron tube including a cathode, a control grid, a screen grid, a suppressor grid and an anode arranged in the order recited, an output transformer having at least a primary and a secondary winding, at least one of said windings being tuned to a selected band of frequencies, a source of anode potential having a negative and a positive terminal, said primary winding of said output transformer being connected between said anode and said positive terminal, means connecting said cathode to said negative terminal, said last-mentioned means having substantially zero impedance measured at frequencies within said selected band of frequencies, a dropping resistor connected between said screen grid and said positive terminal, a by-pass capacitor connected between said screen grid and said negative terminal, said by-pass capacitor having substantially zero impedance at frequencies within said selected band, an input transformer having a primary and a secondary winding, at least one of said windings of said input transformer being tuned to said selected band of frequencies, the secondary of said input transformer being connected between said control grid and said suppressor grid, means for supplying the signal to be amplified to said primary of said input transformer, means for extracting an amplified signal from the secondary of said output transformer, and a neutralizing network comprising a resistor and capacitor in parallel combination connecting said suppressor grid to said negative terminal, said capacitor having a capacitance substantially directly proportional to the input capacitance of said amplifier stage and the output capacitance of said electron tube and inversely proportional to the anode-to-control grid capacitance of said tube, said resistor having a value substantially directly proportional to the effective input resistance and the anode-to-control grid capacitance of said tube and inversely proportional to the output capacitance of said tube, the impedance of said network being such as to effectively neutralize energy feedback through the interelectrode capacitances of said tube.

6. A signal amplifier stage for amplifying signals within a predetermined band of frequencies comprising an electron tube having a cathode, a control grid, a screen grid, a suppressor grid and an anode arranged in the order recited, a source of anode supply potential, a load impedance connected between said anode and one terminal of said source of potential, means connecting a second terminal of said source of potential to said cathode, means connected between a point of reference potential and said cathode and said screen grid for maintaining said cathode and said screen grid at fixed potentials for all frequencies within said band, means for applying the signal to be amplified between said control grid and said suppressor grid, and a resistor and a capacitor in parallel combination connecting said suppressor grid to said point of reference potential, said parallel combination being separate from the anode-cathode path of said electron tube, said capacitor having a capacitance substantially directly proportional to the input capacitance of said amplifier stage and the output capacitance of said electron tube and inversely proportional to the anode-to-control grid capacitance of said tube, said resistor having a value substantially directly proportional to the effective input resistance and the anode-to-control grid capacitance of said tube and inversely proportional to the output capacitance of said tube.

7. A signal amplifier stage for amplifying signals within a predetermined band of frequencies comprising an electron tube having a cathode, a control grid, a screen grid, a suppressor grid and an anode arranged in the order recited, a source of anode supply potential, a load impedance connected between said anode and said source of potential, means for maintaining said cathode and said screen grid at fixed potentials for all frequencies within said band, means for applying the signal between said control grid and said suppressor grid, and a resistor and a capacitor in parallel combination connecting said suppressor grid to a point of fixed potential, said parallel combination being separate from the anode-cathode path of said electron tube, said resistor and said capacitor having values such as to balance the equivalent four terminal bridge network of said amplifier stage, said bridge network having as output terminals the anode and cathode respectively of said tube and as input terminals the control grid and a suppressor grid of said tube, the arms of said bridge taken in succession, starting with said anode terminal, comprising the anode-to-suppressor grid capacitance of said tube, as a second arm the screen grid-to-suppressor grid capacitance, the cathode-to-suppressor grid capacitance, said neutralizing capacitor and said neutralizing resistor in parallel combination, as a third arm the control grid-to-cathode capacitance, control grid-to-screen grid capacitance and the input resistance of said tube in parallel combination, and as a fourth arm the control grid-to-anode capacitance.

8. A signal amplifier stage for amplifying signals within a predetermined band of frequencies comprising an electron tube having a cathode, a control grid, a screen grid, a suppressor grid and an anode arranged in the order recited, a source of anode supply potential, a load impedance connected between said anode and one terminal of said source of potential, means connecting a second terminal of said source of potential to said cathode, means connected between a point of reference potential and said cathode and said screen grid for maintaining said cathode and said screen grid at fixed potentials for all frequencies within said band, means for applying a signal to be amplified between said control grid and said suppressor grid, and a resistor and a capacitor in parallel combination connecting said suppressor grid to said point of reference potential, said parallel combination being separate from the anode-cathode path of said electron tube, said capacitor having a capacitance substantially equal to the product of the effective capacitance between said control grid and said cathode and the effective capacitance between said anode and said suppressor grid divided by the capacitance between said anode and said control grid, said resistor having a resistance substantially equal to the input resistance of said amplifier stage multiplied by the capacitance between said anode and said control grid and divided by the capacitance between said anode and said suppressor grid.

9. A signal amplifier stage for amplifying signals within a predetermined band of frequencies comprising an electron tube having a cathode, a control grid, a screen grid, a suppressor grid and an anode arranged in the order recited, a source of anode supply potential, a load impedance connected between said anode and one terminal of said source of potential, means connecting a second terminal of said source of potential to said cathode, means connected between a point of reference potential and said cathode and said screen grid for maintaining said cathode and said screen grid at fixed potential for all frequencies within said band, a transformer having at least a primary and a secondary winding, said secondary winding being connected at the respective ends thereof to said control grid and said suppressor grid, means for supplying the signals to be amplified to said primary winding, and a neutralizing network separate from the anode-cathode circuit of said electron tube and including a resistor and a capacitor in parallel combination connecting said suppressor grid to said point of reference potential, said capacitor having a capacitance substantially equal to the product of the effective capacitance between said control grid and said cathode and the effective capacitance between said anode and said suppressor grid divided by the capacitance between said anode and said control grid, said resistor having a resistance substantially equal to the input resistance of said amplifier stage multiplied by the capacitance between said anode and said control grid and divided by the capacitance between said anode and said suppressor grid.

References Cited in the file of this patent

UNITED STATES PATENTS

| | | |
|---|---|---|
| 2,010,253 | Barton | Aug. 6, 1935 |
| 2,154,327 | Freeland | Apr. 11, 1939 |
| 2,357,442 | Dodington | Sept. 5, 1944 |
| 2,647,958 | Barney | Aug. 4, 1953 |